United States Patent
Yamazaki et al.

(10) Patent No.: US 7,564,089 B2
(45) Date of Patent: Jul. 21, 2009

(54) SEMICONDUCTOR DEVICE

(75) Inventors: Soichi Yamazaki, Yokohama (JP); Katsuaki Natori, Yokohama (JP); Koji Yamakawa, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 19 days.

(21) Appl. No.: 10/911,501

(22) Filed: Aug. 5, 2004

(65) Prior Publication Data
US 2005/0212028 A1 Sep. 29, 2005

(30) Foreign Application Priority Data
Mar. 26, 2004 (JP) ............................. 2004-092434

(51) Int. Cl.
*H01L 27/108* (2006.01)
(52) U.S. Cl. ................... 257/306; 257/307; 257/309; 257/310; 257/534
(58) Field of Classification Search ................ 257/296, 257/306, 307, 309, 310, 532, 534, 535
See application file for complete search history.

(56) References Cited

U.S. PATENT DOCUMENTS 4,419,812 A * 12/1983 Topich ..................... 438/238
5,208,725 A * 5/1993 Akcasu ..................... 361/313
5,604,145 A * 2/1997 Hashizume et al. ......... 438/240
5,939,766 A * 8/1999 Stolmeijer et al. .......... 257/534
6,100,574 A * 8/2000 Norstrom et al. ............ 257/532
6,177,716 B1 * 1/2001 Clark ........................ 257/532
2002/0017675 A1 * 2/2002 Tanaka ...................... 257/310

FOREIGN PATENT DOCUMENTS

| JP | 5-47172 | 2/1993 |
| JP | 7-193137 | 7/1995 |
| JP | 2000-323668 | 11/2000 |
| JP | 2004-134659 | 4/2004 |

* cited by examiner

*Primary Examiner*—Matthew E Warren
(74) *Attorney, Agent, or Firm*—Oblon, Spivak, McClelland, Maier & Neustadt, P.C.

(57) ABSTRACT

There is disclosed a semiconductor device comprising a semiconductor substrate, and a capacitor provided above the semiconductor substrate, and including a bottom electrode, a dielectric film formed on the bottom electrode, and a top electrode formed on the dielectric film and having a plurality of hole patterns.

4 Claims, 4 Drawing Sheets

SEMICONDUCTOR DEVICE

CROSS-REFERENCE TO RELATED APPLICATIONS

This application is based upon and claims the benefit of priority from prior Japanese Patent Application No. 2004-092434, filed Mar. 26, 2004, the entire contents of which are incorporated herein by reference.

BACKGROUND OF THE INVENTION

1. Field of the Invention

The present invention relates to a semiconductor device having a capacitor.

2. Description of the Related Art

In recent years, a ferroelectric memory using a ferroelectric film as a capacitor dielectric film, that is, FeRAM (Ferroelectric Random Access Memory) has been developed.

A signal charge stored in a capacitor usually depends on the capacitor area. For this reason, if the capacitor occupied area decreases with high integration of the ferroelectric memory, it is difficult to store sufficient signal charge in the capacitor. Therefore, it is important to improve capacitor characteristics, and thereby increase charge stored per capacitor unit area.

The following proposal has been made as a conventional technique in JPN. PAT. APPLN. KOKAI Publication No. 7-193137. According to the proposal, the side portion of the capacitor is used to increase capacitance. However, even if the side portion of the capacitor is used, the capacitor characteristics do not so improve; therefore, it is difficult to essentially solve the problem.

As described above, it is conventionally difficult to improve the capacitor characteristics, and thereby increase the charge stored in the capacitor.

BRIEF SUMMARY OF THE INVENTION

According to a first aspect of the present invention, there is provided a semiconductor device comprising: a semiconductor substrate; and a capacitor provided above the semiconductor substrate, and including a bottom electrode, a dielectric film formed on the bottom electrode, and a top electrode formed on the dielectric film and having a plurality of hole patterns.

According to a second aspect of the present invention, there is provided a semiconductor device comprising: a semiconductor substrate; and a first capacitor provided above the semiconductor substrate, and including a bottom electrode, a dielectric film formed on the bottom electrode, and a top electrode formed on the dielectric film and having a plurality of convex patterns.

DETAILED DESCRIPTION OF THE INVENTION

Embodiments of the present invention will be described below with reference to the accompanying drawings.

First Embodiment

Figure 1:
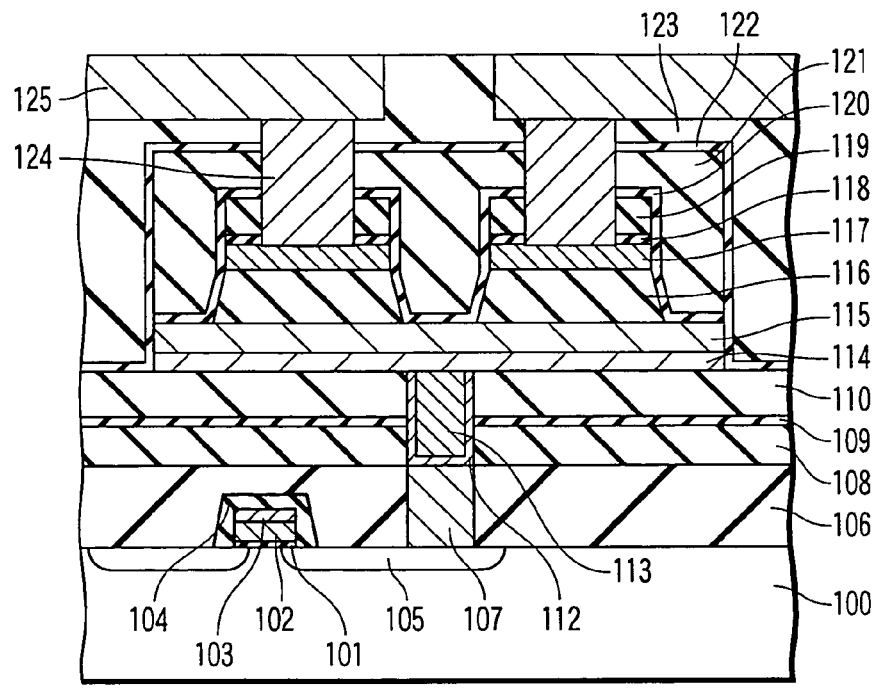
FIG. 1 is a cross-sectional view schematically showing the structure of a semiconductor device according to a first embodiment of the present invention.

FIG. 1 is a cross-sectional view schematically showing the structure of a semiconductor device (ferroelectric memory) according to a first embodiment of the present invention.

A p-silicon substrate (semiconductor substrate) 100 is provided with a MIS transistor. The MIS transistor is formed of a gate insulating film 101, gate electrode, silicon nitride film 104, and source/drain diffusion layer 105. The gate electrode comprises a polysilicon film 102 and a W silicide film 103. The silicon nitride film 104 functions as gate cap film and gate sidewall film.

The MIS transistor is covered with an interlayer insulating film 106. A contact hole penetrating through the interlayer insulating film 106 is formed with a polysilicon plug 107 connected to one of the source/drain diffusion layer 105. Interlayer insulating films 108, 109 and 110 are successively formed on the interlayer insulating film 106. A contact hole penetrating these interlayer insulating films 108, 109 and 110 is formed with a barrier metal film 112 and a tungsten (W) plug 113.

A conductive barrier film 114 is formed on the interlayer insulating film 110. The conductive barrier film 114 is connected to the source/drain diffusion layer 105 via tungsten plug 113 and polysilicon plug 107. A capacitor bottom electrode 115, capacitor dielectric film 116 and capacitor top electrode 117 are successively formed on the conductive barrier film 114. A ferroelectric capacitor is formed of the foregoing bottom electrode 115, dielectric film 116 and top electrode 117. Ferroelectric films formed of metal oxides such as $Pb(Zr_xTi_{1-x})O_3$ film (PZT film) and $SrBi_2Ta_2O_9$ film (SBT film) are used as the dielectric film 116. In the first embodiment, the PZT film is used as the dielectric film 116. Detailed structure of the ferroelectric memory will be described later.

An alumina ($Al_2O_3$) film 118 and a silicon oxide film 119 are formed on the capacitor top electrode 117. The foregoing alumina film 118 and silicon oxide film 119 are used as a mask when the top electrode 117 and dielectric film 116 are etched using RIE (reactive ion etching).

The structure described above is covered with an alumina film 122. An interlayer insulating film 123 is formed around the alumina film 122. A via hole penetrating the films described above is formed with an aluminum (Al) plug 124 connected to the top electrode 117. The films described above are the alumina film 118, silicon oxide film 119, alumina film 120, silicon oxide film 121, alumina film 122 and interlayer insulating film 123. The aluminum plug 124 is connected with an aluminum interconnection (wiring) 125.

Figure 2:
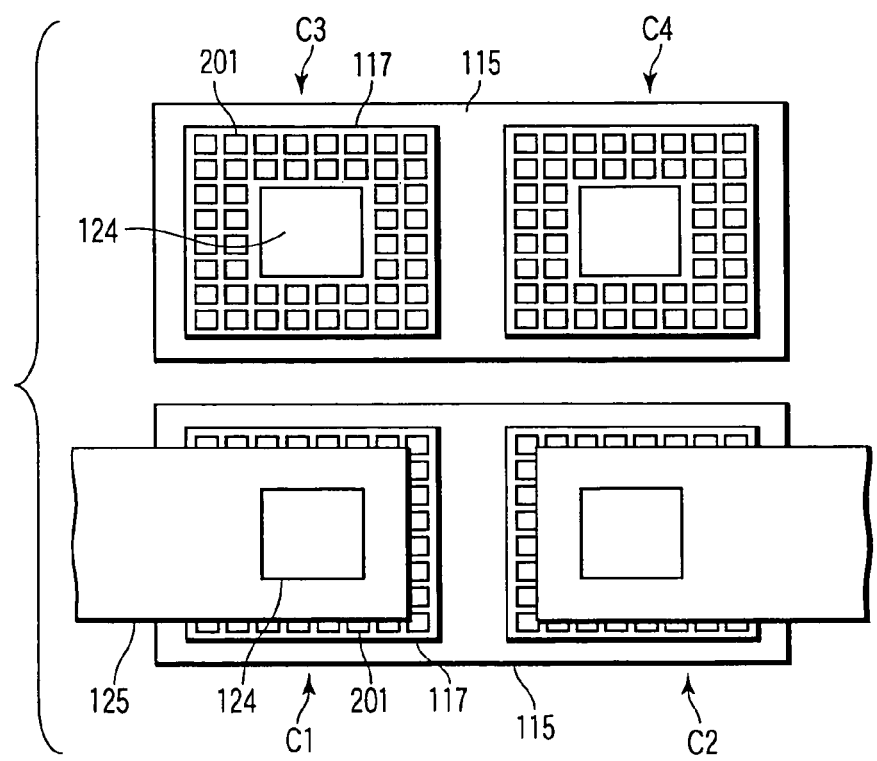
FIG. 2 is a plan view schematically showing the details of each pattern according to the first embodiment of the present invention.

FIG. 2 is a plan view schematically showing each pattern of the bottom electrode 115, top electrode 117, aluminum plug 124 and aluminum interconnection 125 shown in FIG. 1. In FIG. 2, the aluminum interconnection 125 is shown with respect to capacitors C1 and C2. However, for convenience of explanation, no aluminum interconnection 125 is shown with respect to capacitors C3 and C4. According to the first embodiment, the top electrode 117 has a plurality of hole patterns 201 as illustrated in FIG. 2. The hole patterns 201 are arranged like a mesh. The plane shape of each hole pattern 201 may be the same or different.

Figure 3:
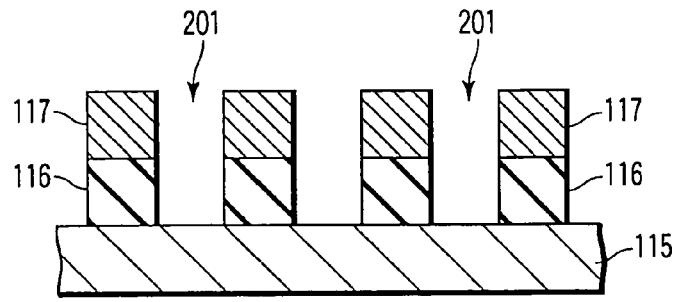
FIG. 3 is a cross-sectional view schematically showing the bottom electrode, dielectric film and top electrode according to the first embodiment of the present invention.
Figure 4:
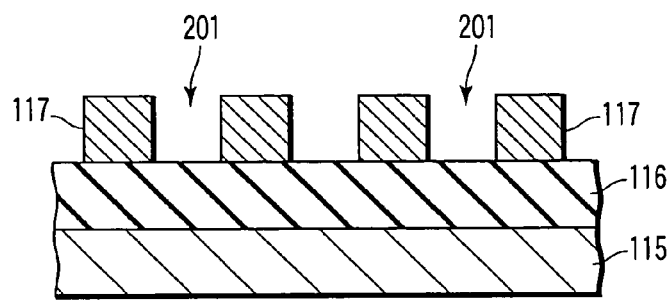
FIG. 4 is a cross-sectional view schematically showing the bottom electrode, dielectric film and top electrode according to a modification example of the first embodiment of the present invention.

FIG. 3 is a cross-sectional view schematically showing the bottom electrode 115, dielectric film 116 and top electrode 117 shown in FIG. 1 (i.e., cross-sectional view showing a region where hole patterns 201 are formed). As depicted in FIG. 3, the dielectric film 116 has hole patterns corresponding to the hole patterns 201 of the top electrode 117. As seen from FIG. 4, the dielectric film 116 does not necessarily have the hole patterns described above. In this case, the dielectric film 116 exists under the hole patterns 201 of the top electrode 117.

In the ferroelectric capacitor, the dielectric film receives damage when the electrode films and dielectric film are patterned using RIE. In order to recover the damage caused in the dielectric film, heat treatment (recovery annealing) must be carried out in an oxygen atmosphere.

In the first embodiment, the top electrode 117 is formed with the hole patterns 201. Therefore, oxygen is sufficiently supplied to the dielectric film 116 via these hole patterns 201 during the recovery annealing. In other words, the structure shown in FIG. 3 serves to diffuse oxygen supplied via the hole patterns 201 from the side of the dielectric film 116 to the internal portion thereof. The structure shown in FIG. 4 serves to diffuse oxygen supplied via the hole patterns 201 from the upper surface of the dielectric film 116 to the internal portion thereof.

Therefore, according to the first embodiment, the dielectric film 116 receiving damage is sufficiently repaired by the recovery annealing. As a result, it is possible to improve the capacitor characteristics, and thus increase the charge stored in the capacitor. Thus, even if the capacitor occupied area decreases with high integration of the ferroelectric memory, a sufficient signal charge can be stored in the capacitor. Consequently, it is possible to obtain a semiconductor device which is excellent in characteristics and reliability.

As shown in FIG. 1, the COP (capacitor on plug) structure in which the bottom electrode 115 is formed on the plug 113 is provided. In the COP structure, the plug 113 is oxidized in the recovery annealing; for this reason, there is a possibility that connection failure of the plug 113 occurs. However, in the first embodiment, oxygen is sufficiently supplied to the dielectric film 116 via the hole patterns 201 in the recovery annealing, so that the recovery annealing time can be shortened. Therefore, it is possible to prevent the plug 113 from being oxidized in the recovery annealing, and to prevent connection failure of the plug 113.

Second Embodiment

A semiconductor device (ferroelectric memory) according to a second embodiment of the present invention will be described below. The basic structure of the ferroelectric memory is substantially the same as FIG. 1; therefore, the details are omitted.

Figure 5:
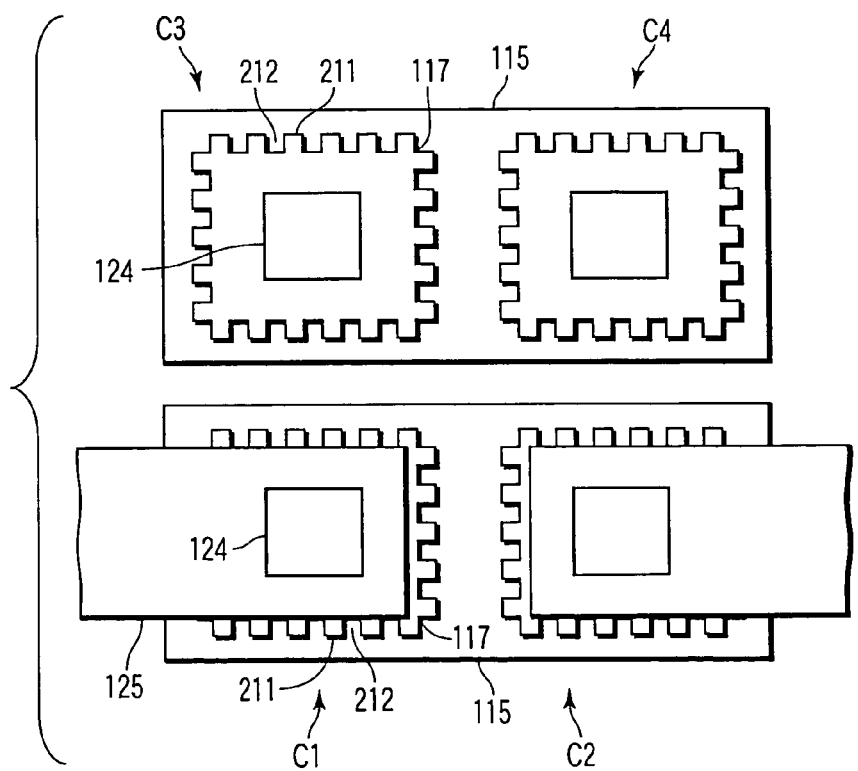
FIG. 5 is a plan view schematically showing the details of each pattern according to a second embodiment of the present invention.

FIG. 5 is a plan view schematically showing each pattern of bottom electrode 115, top electrode 117, aluminum plug 124 and aluminum interconnection 125 in the second embodiment. In FIG. 5, the aluminum interconnection 125 is shown with respect to capacitors C1 and C2. However, for convenience of explanation, no aluminum interconnection 125 is shown with respect to capacitors C3 and C4. According to the second embodiment, the top electrode 117 has a plurality of convex patterns 211 as illustrated in FIG. 5. The convex patterns 211 are arranged like a comb along the outer periphery of the top electrode 117.

Figure 6:
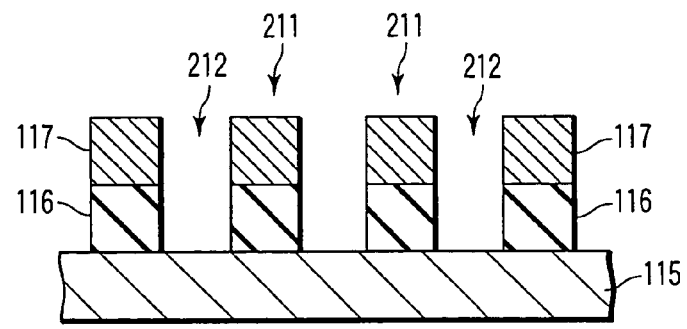
FIG. 6 is a cross-sectional view schematically showing the bottom electrode, dielectric film and top electrode according to the second embodiment of the present invention.
Figure 7:
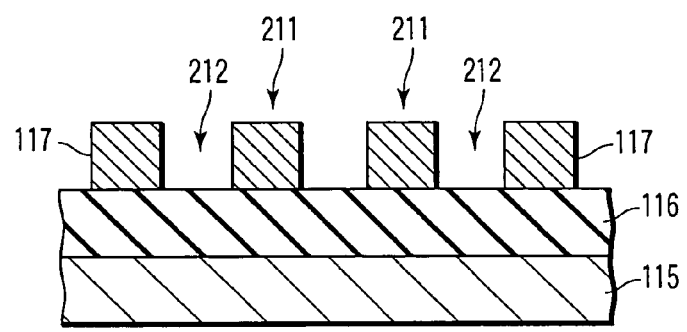
FIG. 7 is a cross-sectional view schematically showing the bottom electrode, dielectric film and top electrode according to a modification example of the second embodiment of the present invention.

FIG. 6 is a cross-sectional view schematically showing the bottom electrode 115, dielectric film 116 and top electrode 117 in the second embodiment (i.e., a cross-sectional view showing a region where convex patterns 211 are formed). As depicted in FIG. 6, the dielectric film 116 has convex patterns corresponding to the convex patterns 211 of the top electrode 117. As seen from FIG. 7, the dielectric film 116 does not necessarily have the convex patterns described above. In this case, the dielectric film 116 exists under a space (concave pattern) 212 between adjacent convex patterns 211.

In the second embodiment, the top electrode 117 is formed with the convex patterns 211. Therefore, oxygen is sufficiently supplied to the dielectric film 116 via the space 212 between the convex patterns 211 during the recovery annealing. In other words, the structure shown in FIG. 6 serves to diffuse oxygen supplied via the space 212 between the convex patterns 211 from the side of the dielectric film 116 to the internal portion thereof. The structure shown in FIG. 7 serves to diffuse oxygen supplied via the space 212 between the convex patterns 211 from the upper surface of the dielectric film 116 to the internal portion thereof.

Therefore, according to the first embodiment, the dielectric film 116 receiving damage is sufficiently repaired by the recovery annealing, like the first embodiment. As a result, it is possible to increase the charge stored in the capacitor, like the first embodiment. Thus, it is possible to obtain a semiconductor device which is excellent in characteristics and reliability. In addition, the recovery annealing time is shortened like the first embodiment; therefore, it is possible to prevent the plug from being oxidized in the recovery annealing.

Third Embodiment

A semiconductor device (ferroelectric memory) according to a third embodiment of the present invention will be described below. The basic structure of the ferroelectric memory is substantially the same as FIG. 1; therefore, the details are omitted.

Figure 8:
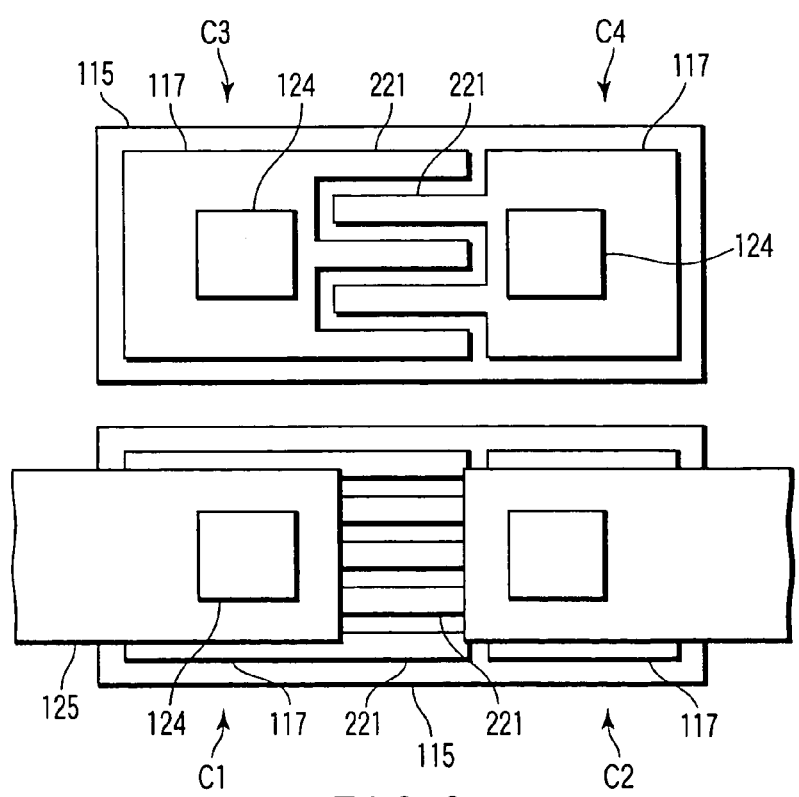
FIG. 8 is a plan view schematically showing the details of each pattern according to a third embodiment of the present invention.

FIG. 8 is a plan view schematically showing each pattern of the bottom electrode 115, top electrode 117, aluminum plug 124 and aluminum interconnection 125 in the third embodiment. In FIG. 8, the aluminum interconnection 125 is shown with respect to capacitors C1 and C2. However, for convenience of explanation, no aluminum interconnection 125 is shown with respect to capacitors C3 and C4. According to the third embodiment, the top electrode 117 has a plurality of convex patterns 221 as illustrated in FIG. 8. The convex patterns 221 are arranged like a comb.

The dielectric film 116 may have convex patterns corresponding to the convex patterns 221 of the top electrode, and does not necessarily have the convex patterns, like the second embodiment.

In the third embodiment, a pair of capacitors C1 and C2 adjacent to each other is formed so that the convex patterns 221 of the capacitor C1 and those of the capacitor C2 are alternately arranged, as seen from FIG. 8. More specifically, the convex pattern 221 of the capacitor C2 is arranged in a space (concave pattern) between the convex patterns 221 of the capacitor C1. Capacitors C3 and C4 have the same arrangement described above.

In the third embodiment, the top electrode 117 is formed with the convex patterns 221, like the second embodiment. Therefore, oxygen is sufficiently supplied to the dielectric film 116 via the space between the convex patterns 221 during the recovery annealing. As a result, the same effect as the first and second embodiments is obtained in the third embodiment. The convex patterns 221 of the capacitor C1 (or C3) and those of the capacitor C2 (or C4) are alternately arranged. Consequently, capacitors can be effectively arranged.

The following is an explanation about the capacitor characteristic improvement effect in the foregoing first to third embodiments.

In the first embodiment, the top electrode has a plurality of hole patterns; on the other hand, in the second and third embodiments, the top electrode has a plurality of convex patterns. The top electrode is provided with hole or convex patterns, and thereby, the total line length L of lines defining the pattern of the top electrode inevitably increases. Thus, the ratio (L/S) of the total line length L of lines defining the pattern of the top electrode and the area S of the pattern thereof is effective as a parameter for verifying the capacitor characteristic improvement effect. Incidentally, in the top electrode pattern of the first embodiment, the total line length L is equivalent to the sum of the length of the outer peripheral line of the top electrode pattern and the length of the lines defining the hole patterns. In the top electrode pattern of the second and third embodiments, the total line length L is equivalent to the length of the outer peripheral line of the top electrode pattern.

Figure 9:
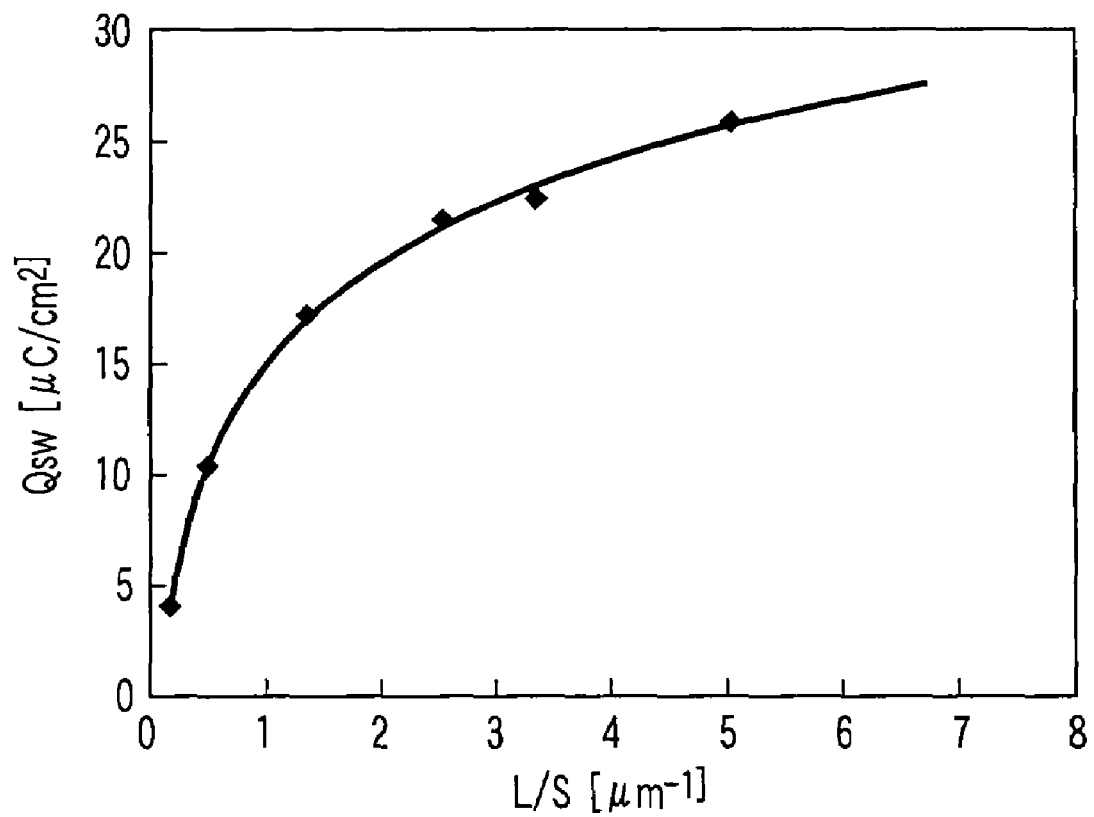
FIG. 9 is a graph to explain the capacitor characteristic improvement effect.

To give an example, the relationship between the ratio L/S and capacitor switching charge Qsw was measured using the top electrode pattern having a plurality of convex patterns shown in the second and third embodiments. The switching charge Qsw can be obtained from the hysteresis curve of the capacitor. The larger the value of the switching charge Qsw is, the greater the charge stored in the capacitor is. More specifically, the area S of the top electrode pattern is kept constant, and the number of convex patterns is varied to change the total line length L. FIG. 9 is a graph showing the measured result. As seen from FIG. 9, the switching charge Qsw greatly increases with an increase in the ratio L/S. Therefore, the ratio L/S is made large (e.g., L/S is set to 2 or more), and thereby, the capacitor characteristics are greatly improved.

The hole and convex patterns are not limited to the shape described in the foregoing embodiments; in this case, any other shapes may be used so long as the ratio L/S is set larger.

The structure described in the foregoing embodiments can be applicable to a series connected TC unit type ferroelectric memory, which includes series connected memory cells each having a transistor having a source terminal and a drain terminal and a ferroelectric capacitor between the two terminals.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
   a semiconductor substrate; and
   a first capacitor provided above the semiconductor substrate, and including a bottom electrode, a dielectric film formed on the bottom electrode and including a ferroelectric film formed of a metal oxide, and a top electrode formed on the dielectric film and having a rectangular first pattern and a plurality of convex patterns projecting from four sides of the rectangular first pattern,
   wherein the dielectric film has convex patterns corresponding to the convex patterns of the top electrode, and the first capacitor is based on interlayer capacitive coupling between the bottom electrode and the top electrode, and
   wherein the bottom electrode has a first part which is located directly under the rectangular first pattern and which is not electrically connected to the rectangular first pattern.

2. The device according to claim 1, wherein the plurality of convex patterns are arranged as a comb.

3. The device according to claim 1, further comprising:
   a second capacitor provided above the semiconductor substrate, adjacent to the first capacitor, and including a top electrode having a plurality of convex patterns,
   wherein the convex patterns of the first capacitor and the convex patterns of the second capacitor being alternately arranged.

4. The device according to claim 1, further comprising:
   a transistor provided on the semiconductor substrate; and
   a plug electrically connecting the bottom electrode and the transistor.

* * * * *